United States Patent [19]

Yao

[11] Patent Number: 4,707,683
[45] Date of Patent: Nov. 17, 1987

[54] INCREASING PRECISION OF ENCODER OUTPUT

[75] Inventor: Koji Yao, Kyoto, Japan

[73] Assignee: Dainippon Screen Mfg. Co., Ltd., Kyoto, Japan

[21] Appl. No.: 805,611

[22] Filed: Dec. 6, 1985

[30] Foreign Application Priority Data

Dec. 6, 1984 [JP] Japan .................... 59-258810

[51] Int. Cl.$^4$ ............................................. H03M 1/30
[52] U.S. Cl. ..................... 340/347 P; 250/231 SE; 340/347 CC; 340/347 M
[58] Field of Search ............ 340/347 D; 250/231 SE

[56] References Cited

U.S. PATENT DOCUMENTS 4,181,962  1/1980  West, Jr. et al. .............. 364/565
4,228,396 10/1980  Palombo et al. .............. 318/313 X Primary Examiner—T. J. Sloyan
Attorney, Agent, or Firm—Lowe, Price, LeBlanc, Becker & Shur

[57] ABSTRACT

An output of a rotary or linear encoder of lower-precision (a subject encoder) is corrected according to that of higher-precision (a reference encoder) to provide higher precision output signals. In the present invention, a frequency multiplied pulse signal is obtained by multiplying a low precision output of a subject encoder by a multiplier. The number of pulses comprised in a portion of the multiplied pulse signal corresponding to a unit movement length of an object connected to the subject encoder is obtained by a hardware operation or by a program stored into a memory. A higher-precision output signal is obtained by dividing the frequency of the multiplied-frequency pulse signal of the subject encoder by a variable divisor corresponding uniquely to the number of high precision reference pulses between low precision subject encoder pulses when the object and the subject encoder are connected and moved. The various divisors can be stored as binary data consisting of high and low states corresponding to a unit movement length obtained by dividing the frequency of an output of the reference encoder at each pulse occurrence of the multiplied frequency pulse signal of the subject encoder. The storage for the divisors is preferably an EPROM which, along with the subject encoder, is connected to a calibration device for determining the high precision divisors. The EPROM and the subject encoder are removable from the calibration device for connection to an image reproduction device.

20 Claims, 9 Drawing Figures

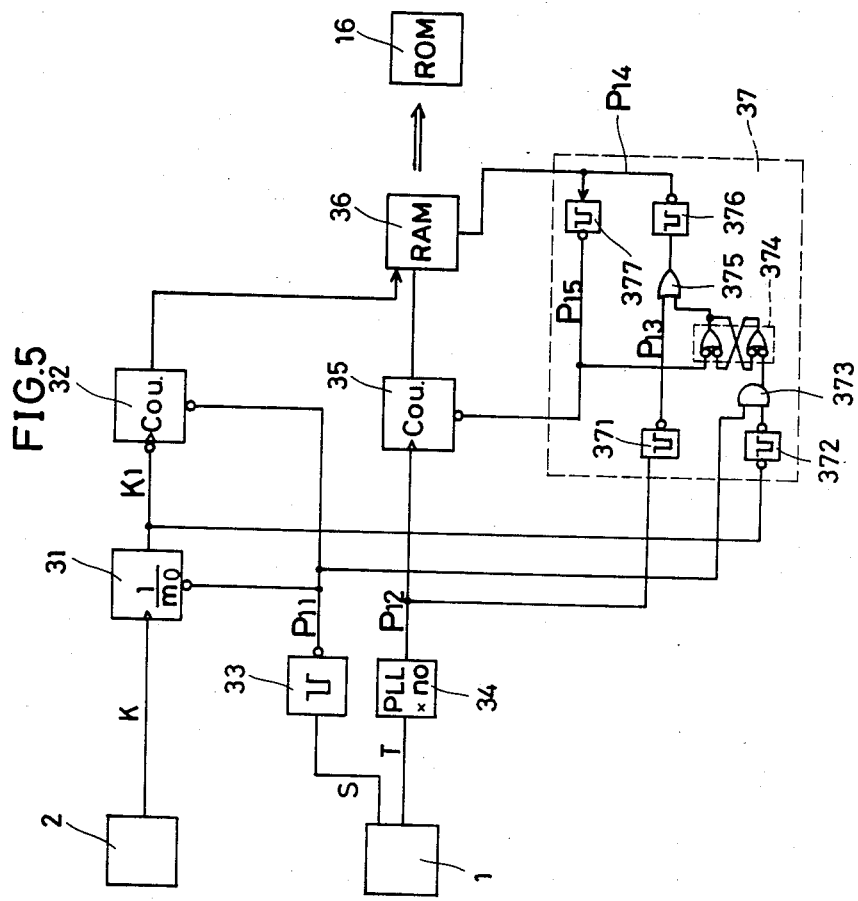

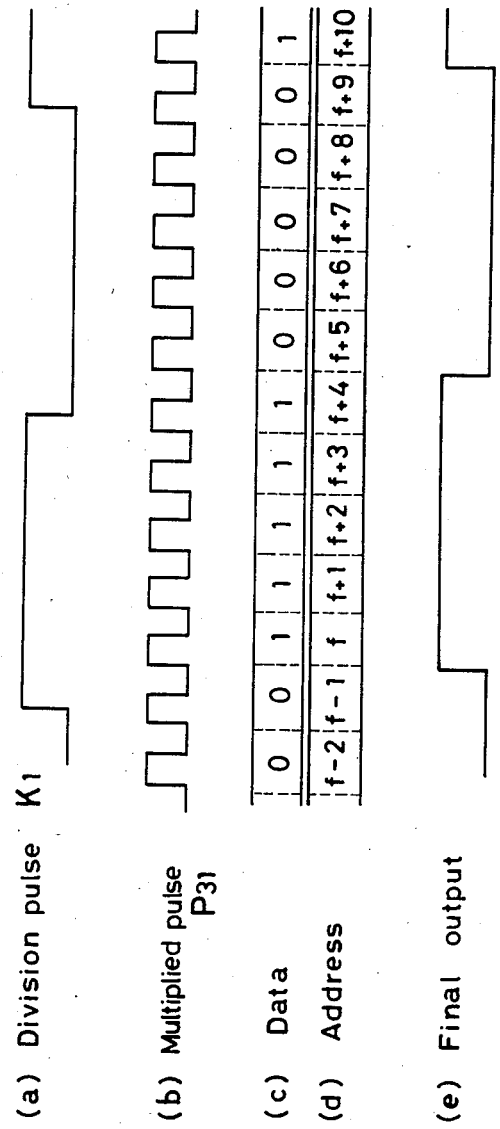

INCREASING PRECISION OF ENCODER OUTPUT

FIELD OF THE INVENTION

The present invention relates to a rotary or linear encoder, and more particularly, to adjusting the angular or positional error of an output of an optical or magnetic rotary encoder rotated at a fixed speed or the error of an output of a linear encoder fed at a fixed speed.

BACKGROUND OF THE INVENTION

It is known that an output of an optical rotary encoder, e.g., a pulse signal representing the angular position of an object connected to the rotary encoder, such as a drum, is obtained by at first receiving via a light receiver a light transmitted through a rotating transparent board having a surface coded with a certain number of radially distributed solid (e.g., black) bars of a uniform width at a uniform pitch, and then amplifying the output of the light receiver in a circuit to form a re-formed sine or rectangular pulse signal. In a reflection-type linear encoder, a light reflected at a board whose surface is coded in a grating by a reflective color (such as white) and an absorptive color (such as black) is received by a light receiver.

The precision of the output of either encoder depends on the precision of the distributed positions of the transparent (reflective) and solid (absorptive) code bars on the boards. Especially for the rotary encoder, the precision of the output thereof depends on the deflection of the rotation center of the transparent and solid code bars.

The same comments are applicable to magnetic encoders.

Therefore, to obtain an encoder of higher precision, the code boards must be accurately produced and, particularly for a rotary encoder, the rotation center of the code bars must be adjusted in detail, which demands are technically and economically difficult to meet.

SUMMARY OF THE INVENTION

Accordingly, it is an object of the present invention to provide a method of and apparatus for increasing the precision of an encoder.

Another object of the present invention is to provide a method and apparatus for increasing the precision of an encoder inexpensively.

In order to achieve the above objects, the present invention adopts the following approach.

The basic technique of the present invention is to produce data for correcting an output of a subject encoder and to store the data in a data storage means by using a reference encoder of higher precision, and to correct the output of the subject encoder according to the stored data when the subject encoder is to be used in practical operation.

In regard to the data storing, the present invention provides three different methods.

In one of the methods, at first a subject encoder is coaxially revolved with a reference encoder, whereupon the number of pulses comprised in an output signal of the reference encoder corresponding to a certain cycle of an output signal of the subject encoder is measured.

According to the thus-obtained pulse number, the number of pulses comprised in a signal obtained by multiplying the output signal of the subject encoder corresponding to a unit movement length of an object to which the subject encoder is connected is computed by means of software or hardware, and the computed result is stored in a data storage means as a divisor mentioned afterwards.

A higher-precision pulse signal, corresponding to the unit movement length of the object connected to the subject encoder, is obtained by dividing the multiplied pulse signal by the divisor (this is of course identical to each unit movement length).

In this regard, the multiplication ratio between the output of the subject encoder and the multiplied pulse signal is determined so that each pulse interval of the multiplied pulse signal is within a permissible range with respect to the unit movement length of the object.

It should be noted that the measuring of the pulse number of the pulse signal of the reference encoder is preferably carried out at intervals of one or one-half cycle of the pulse signal output from the subject encoder.

In another method, at first a subject encoder is coaxially revolved with a reference encoder in the same manner as in the previous method, whereupon an output pulse signal of the reference encoder is divided by a divisor, corresponding to a unit movement length of an object connected to the subject encoder, to provide a division pulse signal. An output of the subject encoder is multiplied to be a multiplied pulse signal, each pulse interval of which is within a permissible range with respect to the unit movement length of the object.

The number of pulses corresponding to a certain cycle of the division pulse signal in the output pulse signal of the subject encoder is counted by a counter, and the count number is stored in a data storage means.

Thereafter, a higher-precision pulse signal as mentioned in the previous method is obtained by dividing the multiplied pulse signal by the divisor.

In still another method, at first a subject encoder is coaxially revolved with a reference encoder, whereupon, a multiplied pulse signal, the same as that obtained in the previous method, is obtained.

The binary value ("0" or "1") of the division pulse signal corresponding to each pulse occurrence of the multiplied pulse signal is then stored in a data storage means, and is read out to be used for producing a higher-precision output pulse signal when the subject encoder is put to practical use.

The above and other objects and features of the present invention can be appreciated more fully from the following detailed description when read with reference to the accompanying drawings.

BRIEF DESCRIPTION OF THE DRAWINGS

FIG. 5 shows another apparatus for producing correction data for an encoder output.

FIG. 7 shows a storage pattern of binary data in a memory and signals concerned.

DETAILED DESCRIPTION OF A PREFERRED EMBODIMENT

Firstly, the principle of the present invention is described. An output pulse signal of an encoder of lower precision (called the "subject" encoder) is processed to provide a higher precision position signal by multiplying the frequency of the signal to provide a multiplied pulse signal by a predetermined fixed value, and dividing the multiplied pulse signal by a divisor which is renewed at intervals corresponding to a unit movement length as follows. The unit movement length is defined as a unit length on an object to which the subject encoder is connected, such as an input scanning or recording drum of a drum scanner.

Figure 1:
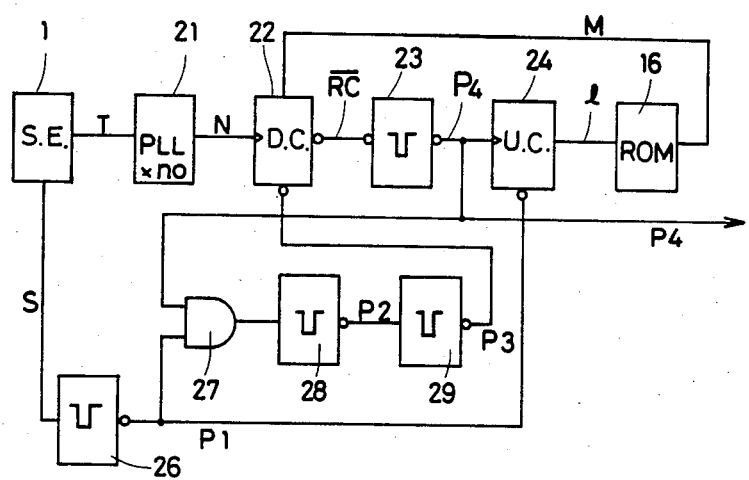
FIG. 1 shows an apparatus for producing a higher-precision position signal by processing an encoder output.
Figure 2:
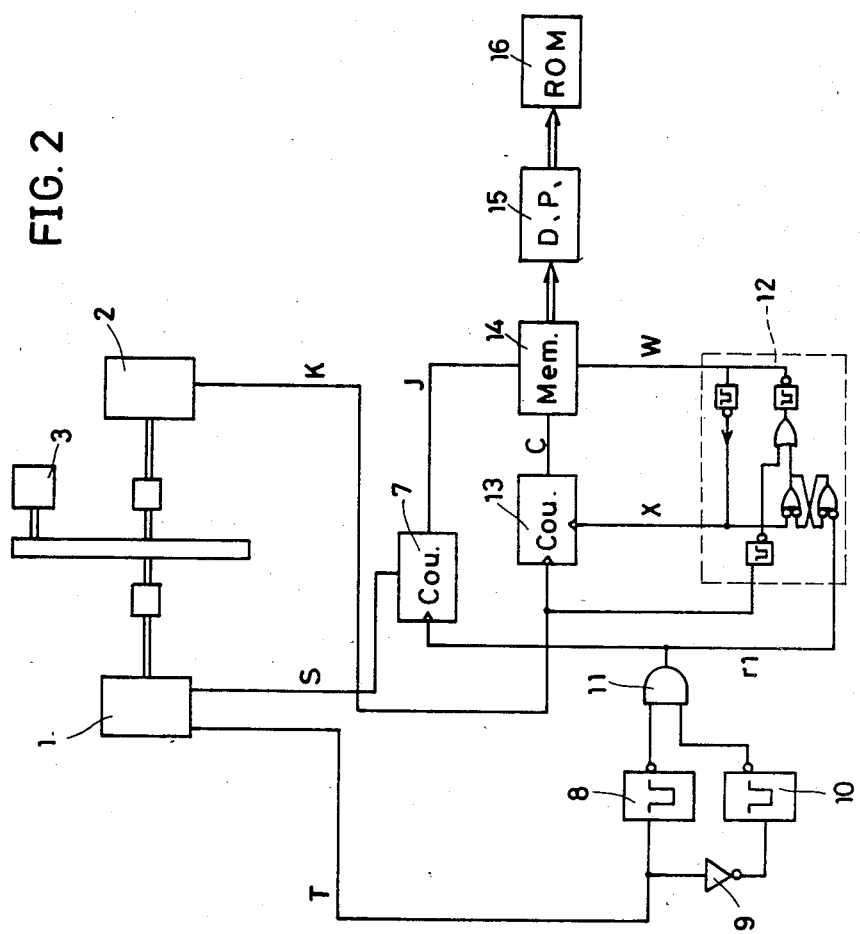
FIG. 2 shows an apparatus for processing the encoder output and producing correction data therefor.

The said divisor, which is produced for each movement length, is stored in a data storage means by the operation of an apparatus as shown in FIG. 2 or 5. When the subject encoder is in operation with an object such as a drum, an apparatus as shown in FIG. 1 operates to divide the multiplied pulse signal obtained by multiplying the output pulse signal from the subject encoder for each unit movement length.

FIG. 1 shows a schematic drawing of an embodiment of the present invention in which an output of a lower-precision encoder (hereinafter called the "subject encoder") is corrected. The apparatus shown in FIG. 1 is provided to be employed in such as an image reproduction system to supply the system with a higher-precision scanning position signal. In the apparatus of FIG. 1, a position data $P_4$, corrected so as to correspond to a unit movement length of subject encoder 1, is obtained by processing an output of the subject encoder 1. In the process, a pulse signal T output from a subject encoder 1 is multiplied in frequency in PLL (Phase locked loop) circuitry 21 to provide a multiplied pulse signal N. The multiplied pulse signal N is frequency divided at predetermined intervals by a corresponding divisor M stored in a ROM 16. The divisor is produced by an apparatus shown in FIG. 2 mentioned afterwards.

In regard to the operation of the apparatus in FIG. 1, first of all an up counter 24 is reset, or initialized (corresponding to an address 0 of the ROM 16), by a start pulse signal S input from the subject encoder 1 via a one-shot multi-vibrator (called the "OSMV" hereinafter) 26. Upon such an initialization, the up counter 24 outputs an address signal 1 to designate to the ROM 16 to output to a down counter 22 a divisor M stored in the address 0 thereof. The down counter 22 outputs a ripple clock pulse signal RC when it counts a number of pulses of the multiplied pulse signal N output from the PLL circuitry 21 equal to the divisor M. The ripple clock pulse signal RC triggers an OSMV 23 to output a corrected position signal $P_4$ to a subsequent apparatus. The corrected position signal $P_4$ increases the count number of the up counter 24 at the same time, thereby causing ROM 16 to output to the down counter 23 a succeeding divisor from the next storage location M. The above-mentioned operation is repeated for each unit movement length of the encoder 1 to output a correspondingly-corrected position signal $P_4$. This operation is later described in further detail.

FIG. 2 shows an apparatus for obtaining such a divisor M for each unit movement length of a subject encoder 1. Precisely, in FIG. 2 the subject encoder 1 is revolved in synchronism with a reference encoder 2 of higher precision by the operation of a motor 3. The subject encoder 1 outputs a start pulse signal S once per revolution and a pulse signal T having $V_0$ pulses per revolution. In an illustrative example described throughout the specification, $V_0=5,000$. In the meantime, the reference encoder 2 outputs via waveform correction circuitry (not shown) a pulse signal K having $W_0$ pulses per revolution. In the illustrative example, $W_0=3,600,000$.

When the subject encoder 1, revolved in synchronism with the reference encoder 2 outputs the start pulse signal S to a counter 7, the count number thereof is cleared.

Meanwhile, the pulse signal T generated by the subject encoder 1 is input to an OSMV 8 as well as to an OSMV 10 via an inverter 9. Outputs of the OSMVs 8 and 10 are input to an AND-gate 11 to be synthesized into a pulse signal $r_1$ having negative pulses occurring in synchronism with each rise and fall of the pulse signal T. In the continuing example, the pulse signal T comprises 5,000 pulses per revolution of the subject encoder 1, therefore, the pulse signal $r_1$ comprises 10,000 pulses per revolution of the same encoder. The pulse signal $r_1$ is input to a clock terminal of the counter 7 to increase its count number j by one.

On the other hand, a pulse signal K output from the reference encoder 2 is input to a counter 13 whose count number is renewed by a reset signal X output from a synchronization circuitry 12 (mentioned afterwards) in synchronism with the pulse signal $r_1$. The counter 13 counts the number of C pulses of the pulse signal K comprised in a half cycle of the pulse signal T and writes the number C into a memory 14 in synchronism with a writing signal W at a corresponding address produced by the counter 7 attached thereto. In this regard, the count number C corresponds to the duration of one pulse of the pulse signal T.

The synchronization circuitry 12 controls the input timing of the count number of the counter 13 to the memory 14 in the following manner.

At first the count number of the counter is increased by one when a pulse of the pulse signal $r_1$ is input thereto. Then the synchronization circuitry 12 outputs the writing signal W to the memory 14 to make it receive the count number C of the counter 13 in synchronism with the rise time of the first pulse of the pulse signal K occurring after the said pulse of the pulse signal $r_1$. After the synchronization circuitry 12 outputs the reset signal X to the counter 13.

In the illustrative example, assuming that the subject encoder 1 outputs a perfect pulse signal T, the count number C of the counter 13 is to be $3,600,000/10,000=360$ for each pulse of the pulse signal $r_1$. Therefore, after 359 counts of the counter 13 there occurs one pulse of the pulse signal $r_1$ which increases the count number j of the counter 7 by one. Then synchronized with the risetime of the next pulse of the pulse signal K, the memory 14 stores the count number C increased to 360 with the count number j of the counter 7 being the writing address thereof. When less than 50 percent of the pulse number comprised in a certain term of the pulse signal T is utilized, the frequency of the data input to the memory 14 can adequately be half or less.

As can be presumed from the above, the count number C of the counter 13 fluctuates about 360 when the precision of the subject encoder 1 is not perfect.

Consequently, each count number C of the counter 13 corresponding to every half cycle of the pulse signal T output from the subject encoder 1 is input to the memory 14 with the output j of the counter 7 being the writing addresses thereof for one revolution of the subject encoder 1.

According to the present invention, the thus-obtained data in the memory 14 is processed to be memorized as division data in the said ROM 16 via a data processor 15 mentioned afterwards. It is now assumed that the subject encoder 1 shown in FIG. 1 is coaxially connected to an input scanning or recording drum of an image reproduction system, and the frequency of the output signal T thereof is multiplied by $n_0$ (in this particular case $n_0=160$) to form a multiplied pulse signal N as shown in FIG. 1. Thereby, a length B of the circumference L of the drum (in this particular case, L=800 mm) corresponding to one pulse interval of the multiplied pulse signal N is obtained according to an equation:

$$B = \frac{c \times \frac{L}{W_o}}{\frac{n_o}{2}} \text{ mm} \quad (1)$$

In this regard, the reason the denominator is $n_0/2$ is that the count number C corresponds to one-half cycle of the pulse signal T output from the subject encoder 1. In this particular case, the length B is B=1 um.

A pulse number m of the multiplied pulse signal N corresponding to a unit movement length $B_0$ (in this case, $B_0=10$ um) is obtained according to an equation $M=B_0/B$.

It must be noted that the unit movement length is not limited to be a length on a drum but may be any possible equivalent.

Figure 3:
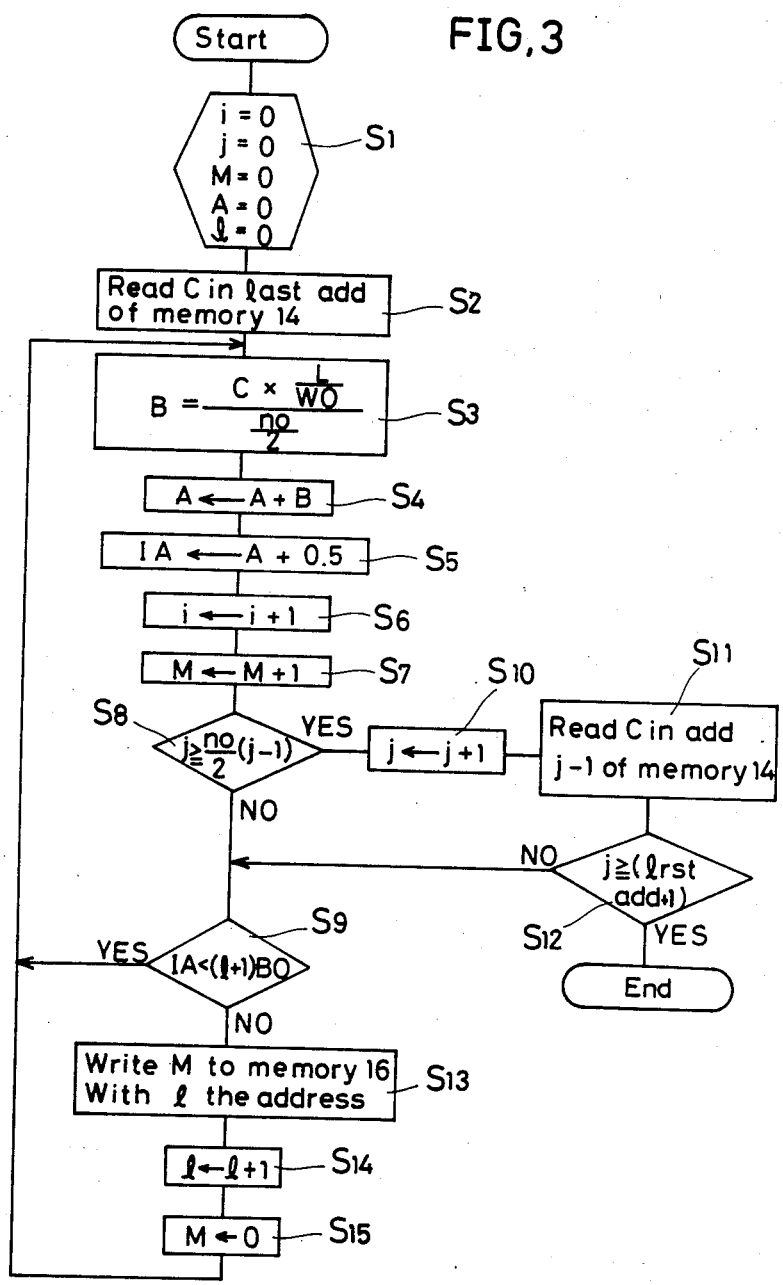
FIG. 3 shows a flow chart of the operation of a data processor shown in FIG. 2.

FIG. 3 shows a flow chart of the data processor 15 for carrying out the above computations.

It is now assumed that the pulse number of the multiplied pulse N corresponding to the present point on the drum from its origin (the time the start pulse signal S is generated) is i; the present address of the memory 14 is j (the output of the counter 7); the present pulse number of the multiplied pulse signal N corresponding to one unit movement length is M (which is to be a divisor for the frequency division of circuitry shown in FIG. 1); the present address of the ROM 16 is l; and a length between the present point and the origin of the drum is A. In the first place, all the variables i, j, M, A, and l are set at zero respectively at step ($S_1$). Then, at step ($S_2$), the value C is read out from the last address of the memory 14.

The reason the value C stored in the last address of the memory 14 is read out is that the multiplied pulse signal N output from the PLL circuitry 21 is delayed by a half cycle from the corresponding output pulse of the subject encoder 1.

At step ($S_3$) the data processor 15 carries out the computation expressed by the equation 1 to obtain the length B on the drum corresponding to one cycle of the multiplied pulse signal N. In the particular illustrative example, the length B becomes:

$$B = \frac{c \times \frac{800}{3,600,000}}{80} \text{ mm.}$$

Since the value C is C=360 when the subject encoder 1 outputs a perfect position signal, the length B becomes B=1 um in the particular case. Then, at step ($S_4$), a computation A+B is carried out and the resultant value takes the place of the value A.

At step ($S_5$) a value 0.5 is added to the value A to produce value IA, by which process possible errors are made to be within a half of a pulse of the multiplied pulse signal N.

Next, on steps ($S_6$) and ($S_7$), the values i and M are increased by one respectively. Then, at step ($S_8$), the renewed value i is compared with a value $(n_0/2)\cdot(j+1)$ to determine whether the value C read out from the address j of the memory 14 is to be subjected to a computation corresponding to the equation (1). When the value i exceeds the value $(n_0/2)\cdot(j+1)$, in other words when the value C read out from the address j of the memory 14 becomes inappropriate to be subjected to the equation (1), the result of the step ($S_8$) becomes affirmative. In this case, a value of j+1 replaces the value j at step ($S_{10}$) to become a renewed value j, and a value C stored in the address j−1 of the memory 14 is read out in step ($S_{11}$) (in the first pass through the process, a value stored in the address 0 is read out). Then it is determined at step ($S_{12}$) whether the address j exceeds the last address plus 1 (including the last address itself). It is noted in this regard the value C stored in the last address is already used in the step ($S_2$). When the result of step ($S_{12}$) is negative, the operation of the CPU proceeds to step ($S_9$). When the result is affirmative, the operation of the CPU terminates because all the data M for one revolution of the subject encoder 1 are stored in the ROM 16.

When the value i is i<$(n_0/2)\cdot(j+1)$ in the step ($S_8$), it is determined at step ($S_9$) whether the value IA obtained in step ($S_5$) exceeds a value $(1+1)B_0$ a multiple of a unit movement length $B_0$ (in the particular case $B_0=10$ um).

When the value IA is IA<$(1+1)B_0$, meaning that the total length from the origin of the encoder 1 is less than the next multiple of the unit movement length $B_0$, the result of the step ($S_9$) becomes affirmative to proceed back to the step ($S_3$), and then the processes of the steps ($S_3$) to ($S_9$) are repeated. When the value IA is IA≧$(1+1)B_0$, the result of the step ($S_9$) becomes negative and the process continues at step ($S_{13}$) to store the present divisor M (for instance, when B=1 um, M=10) in ROM 16 at address l. In the illustrative example, the division value M is approximately 10. Thereafter, the address l is incremented by one at step ($S_{14}$). The value M is cleared at step ($S_{15}$), and operation of the CPU is returned to the step ($S_3$).

Once the ROM 16, which is preferrably programmable (PROM) and erasable (EPROM), has been loaded by the apparatus of FIG. 2 with all the data for one revolution of the subject encoder, it is separated therefom. The ROM is thereafter transferred, along with the subject encoder, to an image reproduction system, for example, where it is used to correct a position signal of the subject encoder 1.

FIG. 1 is a device for correcting a position signal of the subject encoder 1 every 10 um of the circumference L of a drum to which it is connected according to the divisor M stored in the ROM 16. Meanwhile, FIG. 4 shows a timing chart of signals ocurring in the device of FIG. 1.

As mentioned above, the subject encoder 1, operating synchronously with the PLL circuitry 21, outputs the pulse signal T having $V_0$ pulses per revolution.

The frequency of pulse signal T is multiplied by $n_0$ in the PLL circuitry 21 to output to the down counter 22 the multiplied pulse signal N having $n_0V_0$ pulses per revolution. The down counter 22, receiving the divisor M from the ROM 16 as described below, counts down the divisor M. When the count number becomes zero the OSMV 23 correspondingly outputs a corrected signal $P_4$.

Figure 4:
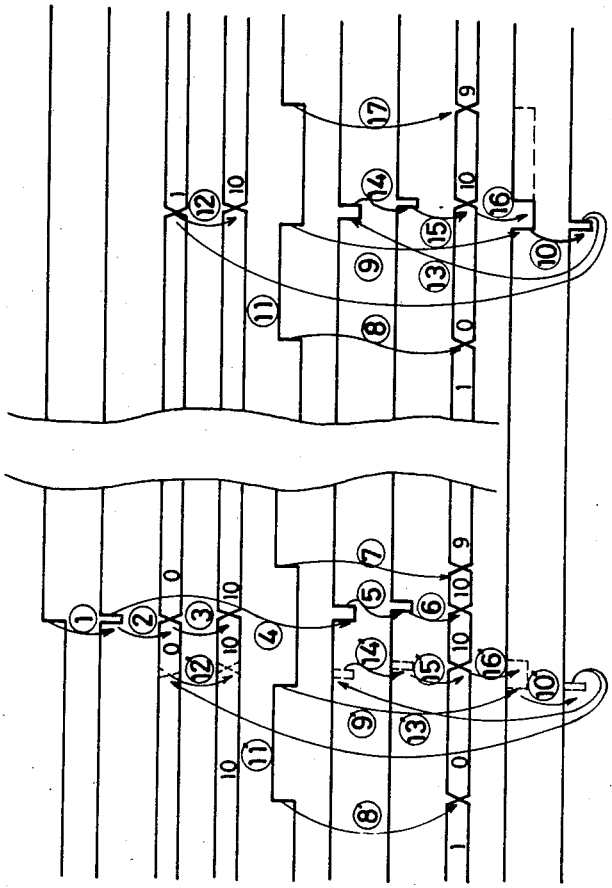
FIG. 4 shows a timing chart of signals formed in the apparatus of FIG. 1.

More precisely, based on a timing chart of FIG. 4, when the subject encoder 1 outputs a start pulse S representing the origin of the rotation thereof to the OSMV 26, the OSMV 26 outputs a negative pulse $P_1$ to a clear terminal of the upward counter 24 as shown at a first step(1) in FIG. 4. The thus-cleared upward counter 24 outputs at (2) a signal of value zero as a reading address 1 to the ROM 16. In response to that ROM 16 at (3) outputs a corresponding divisor M to a data input terminal of the downard counter 22.

On the other hand, the said negative pulse $P_1$ is also input via an AND-gate 27 to an OSMV 28, which thereby outputs a negative pulse $P_2$, as illustrated at (4), synchronized with the risetime of the negative pulse $p_1$. The duration of the negative pulse $P_2$ covers the time required by the upward counter 24 to output the address 1 (in this case, 1=0) and for counter 22 to take in stably the corresponding divisor M from the ROM 16. The negative pulse $P_2$ is input to an OSMV 29, which thereby outputs at (3) a negative pulse $P_3$ synchronized with the risetime of negative pulse $P_2$. The negative pulse $P_3$ provides at (6) a timing for taking in the division number M to the downward counter 22.

The down counter 22 counts down at (7) the divisor M one pulse at a time for each risetime of the multiplied pulse signal N. When the count number of the down counter 22 is reduced at (8) to zero with advance of pulse input to the multiplied pulse signal N, the said ripple clock pulse RC is output at (9) synchronized with the falltime of the pulse of the multiplied pulse signal N corresponding to the count number 0. It should be noted in this regard that the ripple clock pulse RC is output as shown by a broken line when the gate 27 and OSMVs 28 and 29 for imposing a feedback is eliminated from the apparatus of FIG. 1. Consequently, a corrected position signal $P_4$ is output at (10) from the OSMV 23, synchronized with the falltime of the ripple clock pulse RC. In this case, the pulse $P_4$ corresponds to 10 um from the revolution origin.

At (11) the corrected position pulse $P_4$ increments the count number of the upward counter 24, namely the reading address 1 of the ROM 16 (in this case, the address 1 is increased from zero to one). Therefore a divisor M located at the address 1 is read out at (12) to the data input terminal of the down counter 22. The position pulse $P_4$ is also input to the AND-gate 27, which allows the next negative pulse $P_2$ to be generated by the OSMV 28 in the same way as mentioned before in the step (4), and then the next negative pulse $P_3$ is generated at (14) by the OSMV 29. In response to that, at (15) the next division number M is set up to the downward counter 22 synchronized with the negative pulse $P_3$, and the ripple clock pulse signal RC is set back at (16) to "H" (high). Therefore the count number of the downward counter 22 is reduced by one at (17) showing the risetime of the succeeding pulse of the multiplied pulse signal N. In the same manner, the above-mentioned operations illustrated at (8) to (17) are repeatedly carried out with the countdown of the down counter 22 synchronized to each pulse of the multiplied pulse signal N.

It should be incidentally noted that signals indicated by broken lines in FIG. 4 are formed when the position pulse $P_4$, which is generated in synchronism with the falltime of the pulse of the multiplied pulse signal N, occurs before the generation of the start pulse signal S. These signals are given dashed numbers corresponding to the counterparts of the steps described in the previous case.

It is further noted that the position pulse $P_4$, generated every one unit movement length $B_0$, contains an error corresponding to within one pulse of the multiplied pulse signal N corresponding to the length A from the start point. The error is caused in the rounding-off step (9) in FIG. 4. In the illustrative example, the error is ±0.5 um. By contrast, an ordinary encoder generating 5,000 pulses per 1 revolution includes an error corresponding to approximately 8 um on the drum. The error can be further reduced with increase of the multiplier of the encoder output. It is incidentally noted that the pulse number C in the equation (1), which is defined in the above description to be twice the number of pulses in the output pulse signal T of the subject encoder 1, can also be equal to or less than the number of pulses in the pulse signal T.

It is noteworthy that the pulse number of the multiplied pulse signal per unit movement length $B_0$ can also be obtained by an apparatus as shown in FIG. 5 rather than the above-mentioned data processor.

In the device of FIG. 5, a subject encoder 1 and a reference encoder 2 are synchronously revolved. In synchronism with generation of a start pulse signal S from the subject encoder 1, a negative pulse $P_{11}$ is output from an OSMV 33 to initialize a divider 31 and to clear the count number of a counter 32.

The frequency of a pulse signal K output from the reference encoder 2 is divided in divider 31 by $m_0$. In the following description, there is provided a continuing example wherein $m_0=45$. A division pulse signal $K_1$ is output by divider 31 to the counter 32. The count number of the counter 32 is input to a RAM 36 as an address data thereof.

Additionally, a pulse signal T output from the encoder 1 is multiplied by a $n_0$ in a PLL circuitry 34 to provide a multiplied pulse signal $P_{12}$ as an input to a counter 35. The counter 35 outputs the pulse number of the multiplied pulse signal $P_{12}$ to RAM 36 each cycle of the division pulse signal $K_1$ by operation of a synchronization circuitry 37 described below. Consequently, the data output from counter 35 is stored into RAM 36 with the output of the counter 32 being the storage address therefor. The thus-obtained data is equivalent to the divisor M stored in ROM 16 as shown in FIG. 1.

The said synchronization circuitry 37 is used for controlling timing of input data to RAM 36. In operation, the start pulse signal S triggers the OSMV 33 to output a pulse $P_{11}$ via an AND-gate 373 to set a flip-flop circuitry 374 and to cause an output of an OR gate 375 be zero. Synchronized with the risetime of a first pulse of the multiplied pulse signal $P_{12}$ after the occurrence of the pulse $P_{11}$, the count of the counter 35 is increased by one, and an OSMV 371 outputs a negative pulse $P_{13}$ via the OR-gate 375 to an OSMV 376. The OSMV 376 generates a negative pulse $P_{14}$ synchronized with the risetime of the pulse $P_{13}$. The pulse $P_{14}$ is input to RAM 36 as a writing pulse therefor. In response to the writing pulse $P_{14}$, the RAM 36 stores the output of the counter 35 with the output of the counter 32 (zero in this case) being the storing address. Meanwhile an OSMV 377 generates a negative pulse $P_{15}$ synchronized with the risetime of the pulse $P_{14}$ to clear the count number of the counter 35 and reset the flip-flop circuitry 374. The count number of the counter 35 is increased by one synchronized with the risetime of the pulse $P_{12}$.

On the other hand, the divider 31 counts pulses of the pulse signal K output from the reference encoder 2. Every falltime of the pulse signal $K_1$ output from the divider 31 the counter 32 increases the count number thereof while an OSMV 372 generates a negative pulse which, together with the pulse $P_{11}$ is used to set the flip-flop circuitry 374. After that, the count number of the counter 35 is increased by one in synchronism with the risetime of the succeeding pulse of the multiplied pulse signal $P_{12}$. Then the pulse $P_{14}$ is input from the OSMV 376 via the OSMV 371 and the OR-gate 375 to the RAM 36, which thereby stores the data output from the counter 35 at an address determined by the output of the counter 32. Meanwhile the OSMV 377 generates the pulse $P_{15}$ to clear the count number of the counter 35 and reset the flip-flop circuitry 374, which operation is successively carried out for one revolution of the subject encoder 1.

The thus-stored data in the RAM 36 is transferred to the ROM 16 according to a well-known technique, which is then applied to a device as shown in FIG. 1 together with the corresponding subject encoder 1. It should be noted in this regard that the data output from the counter 35 can of course be directly written into the programmable ROM 16, provided that it has a shorter accessing time.

More particularly, under typical conditions RAM 36 acts as a buffer for the PROM. The buffering action is necessary where the write time of the PROM is longer than the interval between pulses being counted. For example, since a programmable ROM may have a write time of 50 s, while a RAM may have a write time of 200 ns, a buffer is used in a situation where an encoder revolves at 10 revolutions per second and produces 10,000 pulses per revolution, since in such a situation a write time $\leq 10$ $\mu$s is required. However, it a ROM with sufficiently short write time, or access time, is used, the data could be written directly into the ROM without requiring the use of a buffer.

Similarly to the previously discussed embodiment of FIG. 2, the ROM 16 is also separable from the apparatus shown in FIG. 5 in order to be connectable, along with the subject encoder, to a utilization device to provide a precision for the subject encoder which is at the same level as the reference encoder.

The degree of precision of the data obtained in the above-mentioned second way is discussed below.

Figure 6A:
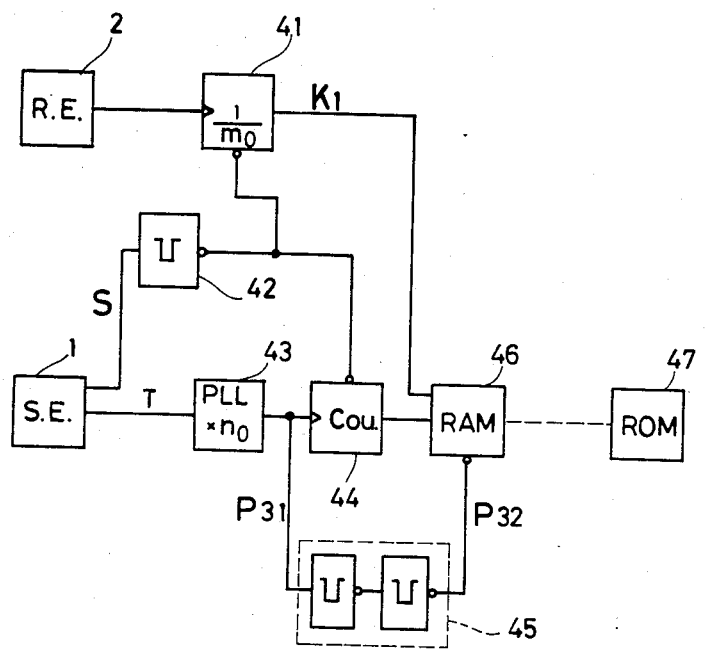
FIGS. 6(A) and (B) show respectively an apparatus for producing correction data for an encoder output
Figure 6B:
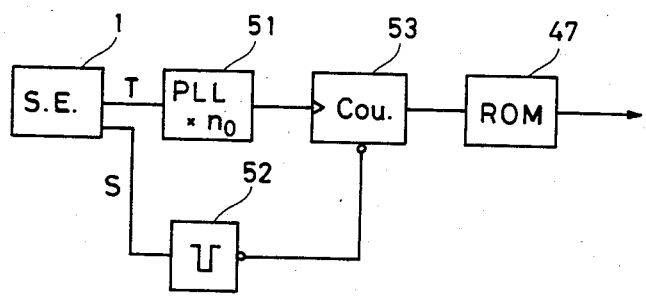

FIGS. 6A and 6B show another embodiment of the present invention in which FIG. 6(A) is a device for storing correction data for the subject encoder 1 in a ROM 47, preferably an EPROM, while FIG. 6(B) is an implementing device to which the stored data is applied together with corresponding subject encoder 1.

In operation, a subject encoder 1 and a reference encoder 2 are synchronously and coaxially revolved in FIG. 6(A). The frequency of an output of the reference encoder 2 is divided by $m_0$ ($m_0=45$ in the illustrative example) in a divider 41. The output pulse signal $K_1$ of divider 41 is input to a RAM 46 as binary data. Synchronized with the risetime of a start pulse signal S output from the subject encoder 1, an OSMV 42 outputs a negative pulse to initialize the divider 41 and to clear a counter 44.

The frequency of an output pulse signal T of the subject encoder 1 is multiplied by $n_0$ (illustratively, $n_0=160$) in PLL circuitry 43, which outputs a multiplied pulse signal $P_{31}$ having $n_0V_0$ pulses per one revolution ($N_0V_0=800,000$ in this case) to the counter 44. The counter 44 counts pulses of the multiplied pulse signal $P_{31}$ at the risetime of the pulses and outputs the count number to the RAM 46 as storage addressed therefor. The multiplied pulse signal $P_{31}$ is also input to an OSMV 45, which thereby outputs a negative pulse $P_{32}$ to the RAM 46 as a writing pulse to time the address information output by the counter 44 after each pulse risetime of the multiplied pulse signal $P_{31}$.

The RAM 46 stores the binary output data (consisting of "1" and "0" data) of the divider 41 at addresses defined by the output of the counter 44. The output of counter 44 is synchronized with the writing pulse output from the OSMV 45 in a manner as shown in FIG. 7.

It should be noted that the ratio between the number of "1" data corresponding to the duration of each "high" pulse and that of "0" data corresponding to the duration of each "low" pulse can be fixed at an arbitrary value by inserting an OSMV between the divider 41 and the RAM 46.

It must be noted that a ROM 47 can directly store the final data, instead of using the RAM 46 shown in FIG. 6(A). When the ROM 47 cannot keep up with the data input timing, RAM 46 is used as a buffer to store the data on behalf of the ROM 47, and then inputs the data to the ROM 47.

The ROM 47, similarly to ROM 16 previously described, is separable from the apparatus of FIG. 6(a) for connection to an image reproduction system to improve the precision of the subject encoder 1 utilized in the system.

In regard of the apparatus shown in FIG. 6(B), the start pulse signal S output from the subject encoder 1 clears the count number of the counter 53 via an OSMV 52. The pulse signal T output from the subject encoder 1 is multiplied by $n_0$ in a PLL circuitry 51 to be input to the counter 53. The count number of the counter 53 is input as an address data to the ROM 47, from which "1" or "0" data is correspondingly output.

Figure 8:
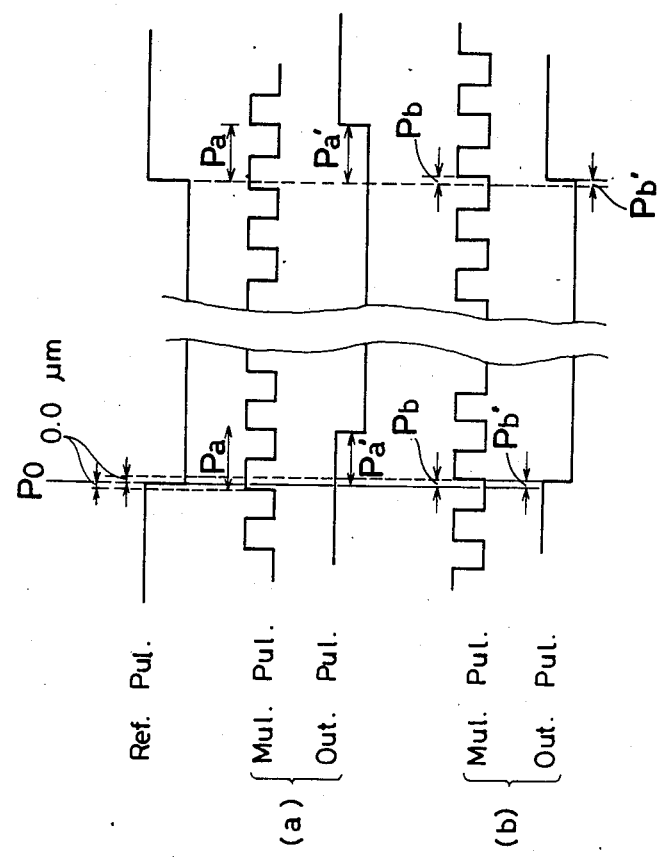
FIG. 8 shows phase errors between several signals.

Referring to a timing chart shown in FIG. 8, the operational precision of the embodiments of FIGS. 5 and 6(A) is discussed in the following by presenting specific numerical examples.

It must be confirmed first of all that each of the multiplied pulse signals output from the PLL circuits 21, 34, 43 and 51 shown respectively in FIGS. 1, 5, 6(A) and 6(B) has a pulse duration corresponding to lum with respect to the circumference of 80 mm of a drum. On the other hand, the reference pulse signal has a comparatively higher precision of $\pm 0.01$ um relative to the ideal position.

Therefore, when the output of each PLL circuit has a maximum phase difference $P_a$ with respect to the reference pulse signal as shown in FIG. 8(a), a phase difference $P_a'$ between the final output pulse signal and the reference pulse signal is to be within one pulse duration of the output signal of the PLL circuitry, which also corresponds to the length of lum on the drum.

When the output of the PLL circuitry has a minimum phase difference $P_b$ with respect to the reference pulse signal as shown in FIG. 8(b), the phase difference $P_b'$ between the final output pulse signal and the reference signal is to be very small as against the length lum on the drum.

Estimating that the lockable scope of the PLL circuitry is within 20% (ordinarily it is around 10%), one pulse duration of the multiplied pulse signal corresponds to no more than 1.2 um on the drum. Therefore the maximum error quantity of the multiplied pulse signal as against the ideal position in the positive direction is to correspond to the length within 1.2 um on the drum.

Meanwhile the minimum error quantity of the multiplied pulse signal in the negative direction corresponds to the length within 0.01 um on the drum defined by the reference pulse signal.

It should be incidentally noted that the subject encoder with the thus-composed correction data can also be used as a reference encoder for other uncorrected subject encoders.

When the subject encoder 1 is to be revolved in a reverse direction, the counter 24 in FIG. 1 or the counter 53 in FIG. 6(B) must be replaced by a downward counter. When the subject encoder 1 is to be revolved in both directions, the counter 24 or the counter 53 is required on occasions different to operate as an up counter or as a down counter according to a well-known method. An up/down counter may be used in this connection.

The data writing step $S_{13}$ of FIG. 3 can be attained either by writing the binary data M obtained by the device of FIG. 2 into the ROM 47 in FIG. 6(B) or by writing the data obtained by the device of FIG. 6(A) into the ROM 16 in FIG. 1.

The frequency division used in the invention can also be attained by using a counter and a coincidence circuit.

The correction of the characteristic of the subject encoder 1 can be attained by at first obtaining error quantity data of the subject encoder 1 and then by carrying out a computation as shown in FIG. 3 instead of using the reference encoder 2 shown in FIGS. 2, 5 and 6(A).

When the subject encoder is revolved rapidly, a RAM can be employed before the final data input to the ROM 16 or 47.

As hereinabove described, the precision of a rotary encoder is proportional to the number of output pulses per one revolution thereof. However, a rotary encoder capable of outputting a signal of higher frequency is ordinarily expensive and is usable only in lower revolution frequency (for instance, 25 r.p.m.) owing to the responsive characteristics of a sensor and multiplication device employed therein.

The present invention can provide a method of and apparatus for increasing the precision of inexpensive and lower-precision rotary encoders so that such an encoder used in higher revolution speeds (for instance 1,200 r.p.m.), which leads to a reduction in the manufacturing cost for such devices.

What is claimed is

1. A method of increasing precision of a position signal by processing a pulse signal obtained by multiplying an output pulse signal of a subject encoder comprising the steps of:
   (a) revolving a subject encoder coaxially with a reference encoder of higher precision:
   (b) counting the number of reference pulses in a pulse signal output from the reference encoder corresponding to a predetermined cycle of a pulse signal output from the subject encoder;
   (c) for every unit movement length of an object connected to the subject encoder, determining the number of reference pulses comprised in a pulse signal interval obtained by multiplying the output pulse signal of the subject encoder by a multiplier, said interval corresponding to a unit movement length, determining the multiplier so that each pulse interval of the multiplied pulse signal is within a predetermined range with respect to the unit movement length and determining as a sequence of divisors a set of numbers provided as respective functions of said numbers of reference pulses in a corresponding sequence of intervals;
   (d) storing the divisors in a data storage means; and
   (e) in operation of the subject encoder, obtaining a corrected output pulse signal corresponding to each unit movement length of the object by dividing the frequency of the multiplied pulse signal of the subject encoder by divisors successively read out from said data storage means.

2. A method as recited in claim 1 in which the divisor is obtained by first measuring a movement encoder according to the number of reference pulses corresponding to a predetermined cycle of the subject encoder output pulse signal, and dividing a unit movement length by the above-mentioned movement length.

3. A method as recited in claim 1 in which the number of reference pulses is counted every half cycle of the output pulse signal of the subject encoder.

4. A method of producing a higher-precision position signal by processing a pulse signal obtained by multiplying a frequency of an output of a subject encoder comprising the steps of:
   (a) revolving a subject encoder coaxially with a reference encoder of higher precision than the subject encoder;
   (b) dividing the frequency of a pulse signal output from the reference encoder to obtain a division pulse signal every predetermined interval corresponding to a unit movement length of an object connected to the subject encoder;
   (c) multiplying the frequency of a pulse signal output from the subject encoder to obtain a multiplied pulse signal such that a movement length of the object connected to the subject encoder corresponding to each pulse of the multiplied pulse signal is accompanied by a permissible error;
   (d) storing into a data storage means as a divisor the number of pulses comprised in the multiplied pulse signal corresponding to every predetermined interval of the division pulse signal; and
   (e) in operation of the subject encoder, obtaining a corrected output pulse signal corresponding to each unit movement length of the object by dividing the frequency of the multiplied pulse signal by divisors successively read out from said data storage means.

5. A method as recited in claim 4 in which the pulse number of the multiplied pulse signal is counted every cycle of the division pulse signal.

6. A method of producing a higher-precision position signal by processing a pulse signal obtained by multiplying an output of a subject encoder comprising the steps of:

(a) revolving a subject encoder coaxially with a reference encoder of higher precision than the subject encoder;

(d) dividing the frequency of a pulse signal output from the reference encoder to obtain a division pulse signal every predetermined interval corresponding to a unit movement length of an object connected to the subject encoder;

(c) multiplying the frequency of a pulse signal output from the subject encoder to obtain a multiplied pulse signal such that a movement length of the object connected to the subject encoder corresponding to each pulse of the multiplied pulse signal is accompanied by a permissible error;

(d) storing into a data storage means the state of the division pulse signal as a binary (high and low) data on every pulse occurrence of the multiplied pulse signal; and (e) in operation of the subject encoder obtaining an increased-precision pulse signal therefrom by reading out the binary data stored in the data storage means every pulse occurrence of a multiplied pulse signal produced by multiplying the output of the subject encoder and dividing the multiplied pulse signal by the content of said data storage means.

7. A method as recited in claim 6 in which the pulse number of the multiplied pulse signal is counted every one-half cycle of the division pulse signal.

8. An apparatus for increasing precision of a signal by processing a pulse signal obtained by multiplying an output pulse signal of a subject encoder comprising:

(a) a subject encoder;
(b) a reference encoder of higher precision than said subject encoder;
(c) a means for coaxially revolving the subject encoder and the reference encoder;
(d) a first counter for counting up in synchronism with each predetermined interval of an output pulse signal of the subject encoder, the counter being cleared by a start pulse signal output from the subject encoder;
(e) a second counter for counting the number of reference pulses output from the reference encoder, the second counter being cleared in synchronism with every predetermined interval of the output pulse signal of the subject encoder;
(f) a first data storage means for memorizing the count number of the second counter at addresses determined by the count number of the first counter;
(g) a data processing means for obtaining the number of pulses comprised in a multiplied pulse signal, obtained by multiplying the output pulse signal of the subject encoder, corresponding to every unit movement length of an object connected to the subject encoder according to the pulse number data stored in the first data storage means for every unit movement length;
(h) a second data storage means for memorizing the resultant obtained by the data processing means at an address which is renewed with every unit movement length of the object connected to the subject encoder, the resultant to be memorized as a divisor; and
(i) means for dividing the multiplied pulse signal by said divisor.

9. An apparatus as recited in claim 8 in which the second counter counts the number of reference pulses in the output pulse signal of the reference encoder every half cycle of the output pulse signal of the subject encoder.

10. An apparatus as recited in claim 8 wherein said reference encoder, said means for coaxially revolving, said first and second counters, said first data storage means and said data processing means form a calibrating means for calibrating said subject encoder with respect to said higher precision reference encoder, and wherein said second data storage means and said subject encoder are connectable to said calibrating means for obtaining the resultant obtained by the data processing means and for memorizing the resultant at the renewed address, said second data storage means being separable from said calibrating means and connectable to utilization apparatus utilizing said subject encoder for improving the precision of signals provided by said subject encoder to said utilization apparatus.

11. An apparatus for obtaining a higher-precision output signal controlling a divisor in dividing a pulse signal obtained by multiplying an output of a subject encoder comprising:

(a) a subject encoder;
(b) a PLL circuit for obtaining a multiplied pulse signal by multiplying the frequency of an output signal of the subject encoder;
(c) a data storage means for memorizing a divisor used in dividing the frequency of the multiplied pulse signal, the divisor being renewed for every unit movement length of an object connected to the subject encoder;
(d) a frequency division means for dividing the frequency of the multiplied pulse signal by the renewed divisors stored in the data storage means; and
(e) an address signal generation means for providing the data storage means with an address signal in accordance with the output of the frequency division means.

12. An apparatus for producing a binary data to be used in processing a multiplied pulse signal obtained by multiplying a pulse signal output from a subject encoder to produce a higher precision output signal comprising:

(a) a subject encoder;
(b) a reference encoder;
(c) a means for coaxially revolving the subject encoder and the reference encoder;
(d) a frequency divider for obtaining a division pulse signal every predetermined interval of which corresponds to a unit movement length of an object connected to the reference encoder by frequency dividing an output pulse signal of the subject encoder;
(e) a PLL circuit for producing a multiplied pulse signal by multiplying the frequency of an output pulse signal of the subject encoder;
(f) a counter for counting the number of pulses in the multiplied pulse signal, the counter being cleared every predetermined cycle of the division pulse signal;
(g) a data storage means for memorizing the output of the frequency divider as a binary data expressed by high and low levels at addresses determined by the count number of the counter; and
(h) means for dividing the multiplied pulse signal by said binary data.

13. An apparatus as recited in claim 12 wherein said reference encoder, said means for coaxially revolving, said counter and said PLL circuit form a calibrating means for calibrating said subject encoder with respect to said higher precision reference encoder, and wherein said data storage means and said subject encoder are connectable to said calibrating means for obtaining the output of the frequency divider and for memorizing the output at the addresses determined by the counter, said data storage means being saparable from said calibrating means and connectable to utilization apparatus utilizing said subject encoder for improving the precision of signals provided by said subject encoder to said utilization apparatus.

14. An apparatus as recited in claim 12 in which the frequency divider comprises a down counter which outputs a pulse when the number of pulses in the multiplied pulse signal input thereto agrees with a divisor previously input thereto and setup for each movement of a predetermined length.

15. An apparatus for obtaining a higher-precision output signal by outputting one of a plurality of binary data consisting of high and low states for a multiplied pulse signal obtained by multiplying the frequency of an output signal of a subject encoder comprising:

(a) a subject encoder;
(b) a PLL circuitry for obtaining a multiplied pulse signal by multiplying the frequency of an output signal of the subject encoder;
(c) a counter for counting the number of pulses of the multiplied pulse signal;
(d) a data storage means for memorizing particular states of the binary data in each address thereof at addresses determined by the count number of the counter; and
(e) means for dividing the multiplied pulse signal by the content of said data storage means.

16. A method of improving a precision of a positioning coder outputting a sequence of pulses representing positional displacement, comprising the steps of:

(a) multiplying the frequency of the position encoder pulse sequence by a multiplier to obtain a multiplied pulse signal;
(b) applying a sequence of divisors, obtained from a high-precision reference encoder output pulse sequence, to divide the multiplied pulse signal frequency to represent successive predetermined increments of movement;

wherein said step of applying includes determining said sequence of divisors as a function of successive numbers of pulses of said high-precision reference encoder output pulse sequence between pulses of said multiplied pulse signal corresponding to said successive increments and storing said divisors in a data storage means.

17. The method of claim 16 wherein said step of applying said sequence of divisors comprises the further step of providing sequential addresses to said data storage means to access said sequential divisors, counting successive numbers of pulses of said multiplied pulse signal corresponding to said successive divisors, generating pulses representing completion of said successive numbers of pulses, and outputting correct position data pulses for said position encoder corresponding to said successive increments of movements at a precision determined by said reference encoder.

18. An apparatus for memorizing a higher-precision signal by processing a pulse signal obtained by multiplying an output of a lower precision subject encoder comprising:

(a) a subject encoder;
(b) a reference encoder;
(c) a means for coaxially revolving the subject encoder and the reference encoder;
(d) a frequency divider for obtaining a division pulse signal every predetermined interval of which corresponds to a unit movement length of an object connected to the reference encoder by frequency dividing an output pulse signal of the subject encoder;
(e) a first counter for counting the number of pulses output from the frequency divider, the first counter being cleared by a start pulse output from the subject encoder;
(f) a PLL circuit for producing a multiplied pulse signal by multiplying the frequency of an output pulse signal of the subject encoder;
(g) a second counter for counting the number of pulses in the multiplied pulse signal, the second counter bering cleared every predetermined cycle of the division pulse signal; and
(h) a data storage means for memorizing the count of the second counter at an address determined by the count of the first counter, the data to be memorized forming a frequency divisor for said multiplied pulse signal.

19. An apparatus as recited in claim 18 in which the second counter counts the number of pulses comprised in the multiplied pulse signal each cycle of the division pulse signal.

20. An apparatus as recited in claim 10 wherein said reference encoder, said means for coaxially revolving, said first and second counters and said PLL circuit form a calibrating means for calibrating said subject encoder with respect to said higher precision reference encoder, and wherein said data storage means and said subject encoder are connectable to said calibrating means for obtaining the count of the second counter and for memorizing the count at the addresses determined by the counter, said data storage means being separable from said calibrating means and connectable to utilization apparatus utilizing said subject encoder for improving the precision of signals provided by said subject encoder to said utilization apparatus.

* * * * *